(12) United States Patent
Sasaki

(10) Patent No.: US 8,334,212 B2
(45) Date of Patent: Dec. 18, 2012

(54) METHOD OF MANUFACTURING A SEMICONDUCTOR DEVICE

(75) Inventor: Toshiyuki Sasaki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 400 days.

(21) Appl. No.: 12/696,127

(22) Filed: Jan. 29, 2010

(65) Prior Publication Data

US 2010/0203738 A1    Aug. 12, 2010

(30) Foreign Application Priority Data

Feb. 9, 2009    (JP) ................................ P2009-027810

(51) Int. Cl.
*H01L 21/311* (2006.01)
*H01L 21/302* (2006.01)

(52) U.S. Cl. .................. 438/696; 438/701; 438/704

(58) Field of Classification Search ........................ None
See application file for complete search history.

(56) References Cited

U.S. PATENT DOCUMENTS

| 2004/0026736 A1* | 2/2004 | Grupp et al. .................. 257/330 |
| 2004/0092075 A1* | 5/2004 | Yeo et al. ........................ 438/305 |
| 2006/0205124 A1* | 9/2006 | Herner ............................ 438/149 |
| 2007/0019122 A1* | 1/2007 | Lee et al. ........................ 349/43 |
| 2009/0020824 A1* | 1/2009 | Kadoshima ................... 257/369 |

FOREIGN PATENT DOCUMENTS

JP    6-53495    2/1994

* cited by examiner

*Primary Examiner* — Shamim Ahmed
*Assistant Examiner* — Bradford Gates
(74) *Attorney, Agent, or Firm* — Finnegan, Henderson, Farabow, Garrett & Dunner, L.L.P.

(57) ABSTRACT

A method of manufacturing a semiconductor device which includes a gate electrode formed in the shape substantially vertical to a semiconductor substrate is disclosed. A gate electrode is formed by anisotropically etching a gate electrode film having a metal-containing film formed on the semiconductor substrate via a gate insulating film to expose a portion of the gate insulating film. A modified film is formed on a side wall of the metal-containing film by modifying the side wall of the metal-containing film. The exposed portion of the gate insulating film is removed and a portion of the gate insulating film sandwiched between the semiconductor substrate and the metal-containing film is recessed so as to recede from the modified side wall of the metal-containing film by isotropically etching. A side portion of the metal-containing film protruding from the receded gate insulating film is removed by isotropically etching.

20 Claims, 5 Drawing Sheets

METHOD OF MANUFACTURING A SEMICONDUCTOR DEVICE

CROSS REFERENCE TO RELATED APPLICATION

This application is based upon and claims the benefit of priority from the prior Japanese Patent Application No. 2009-27810, filed on Feb. 9, 2009, the entire contents of which are incorporated herein by reference.

FIELD OF THE INVENTION

The invention relates to a method of manufacturing a semiconductor device.

DESCRIPTION OF THE BACKGROUND

With higher integration of semiconductor devices, miniaturization of insulated gate field-effect transistors (MOS transistors) has been required for the purpose of inhibiting increase in the chip size.

To meet the requirement, gate electrodes each obtained by stacking a polysilicon film on a refractory metal film or a refractory metallic compound film (hereinafter referred to as a "metal-containing film") are put in use. Here, the metal-containing film is used to inhibit a short channel effect which would occur due to the miniaturization, and accordingly to maintain a conventional threshold voltage. The polysilicon film is used to protect the metal-containing film, and to inhibit increase in the resistance of the gate electrode.

Nevertheless, in the case where RIE (Reactive Ion Etching) is used to etch a gate electrode film obtained by stacking the polysilicon film on the metal-containing film, there is a problem that a skirt-shape etching residue is likely to remain in a lower portion of the gate electrode film after the RIE process because of the three-dimensional structure of the gate electrode.

In addition, the problem that the gate electrode film is formed into a skirt shape or a tapered shape also occurs depending on a type of metal used for the gate electrode film, due to the lower vapor pressure of reaction products of an etching gas with the metal-containing film.

As a result, gate electrodes whose shapes are perpendicular to the semiconductor substrate cannot be obtained, and the gate electrodes vary in shape from one to another. Such variation deteriorates the gate characteristics, thereby leading to a problem of not obtaining MOS transistors having stable characteristics.

The foregoing problems further cause another problem that miniaturization of MOS transistors is so hindered as to make it difficult to inhibit the increase in the chip size.

On the other hand, methods of manufacturing a MOS transistor having a gate electrode using a refractory metal have been known. One of the semiconductor device manufacturing methods of such kind is disclosed in Japanese Patent Application Publication No. 6-53495.

The above method of manufacturing a semiconductor device includes the steps of: depositing a first layer of relatively high density refractory metal on a gate oxide layer formed on a silicon substrate; depositing a second layer of relatively low density refractory metal on the first layer of relatively high density refractory metal; etching the second layer to form an upper gate electrode portion; and etching the first layer to form a lower portion of the gate electrode that extends laterally beyond the upper gate electrode portion.

Nevertheless, the above method of manufacturing a semiconductor device is intended to form an inverted-T-shaped gate electrode, and provides neither disclosure nor suggestion about the above-described problem.

SUMMARY OF THE INVENTION

An aspect of the invention is to provide a method of manufacturing a semiconductor device including, forming a gate electrode by anisotropically etching a gate electrode film having a metal-containing film formed on a main surface of a semiconductor substrate via a gate insulating film to expose a portion of the gate insulating film, forming a modified film on a side wall of the metal-containing film by modifying the side wall of the metal-containing film, removing the exposed portion of the gate insulating film and recessing a portion of the gate insulating film sandwiched between the semiconductor substrate and the metal-containing film so as to recede from the modified side wall of the metal-containing film by isotropically etching the gate insulating film, removing a side portion of the metal-containing film protruding from the receded gate insulating film by isotropically etching the metal-containing film.

BRIEF DESCRIPTION OF THE DRAWINGS

FIG. 1A is a cross-sectional view of the semiconductor device. FIG. 1B is an enlarged cross-sectional view of a main portion of the semiconductor device.

DETAILED DESCRIPTION OF THE INVENTION

An embodiment of the invention will be hereinafter described with reference to the drawings.

Embodiment

Figure 1A:
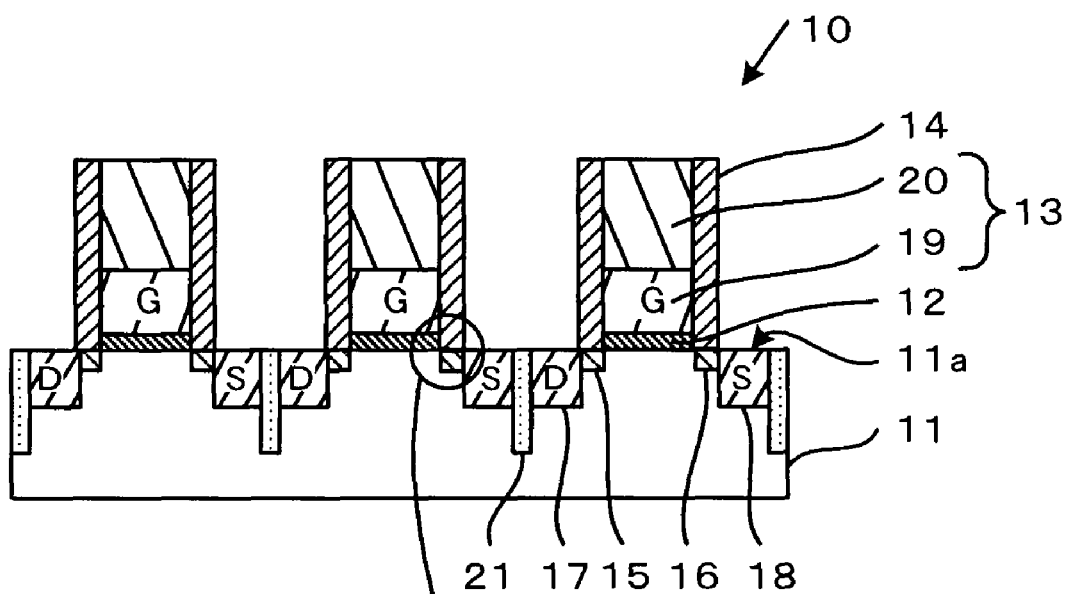
FIGS. 1A and 1B are diagrams showing a semiconductor device according to an embodiment of the invention.
Figure 1B:
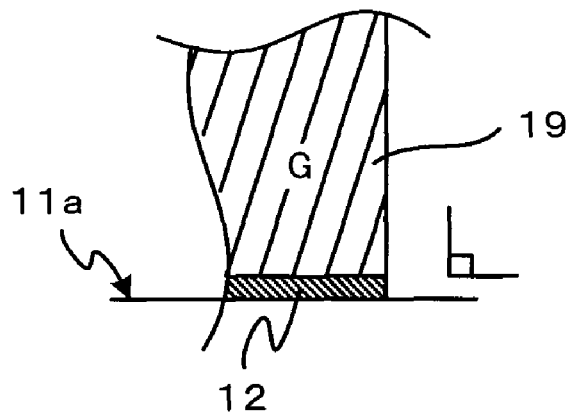

FIGS. 1A and 1B are drawings showing a semiconductor device according to the embodiment of the invention. FIG. 1A is a cross-sectional view of the semiconductor device. FIG. 1B is an enlarged cross-sectional view of a main portion of the semiconductor device. FIGS. 2 to 4 are cross-sectional views sequentially showing main portions of steps of manufacturing a semiconductor device according to the embodiment of the invention.

The embodiment is an example of manufacturing a semiconductor device which has a MOS transistor with an extension structure including a low-concentration region and a high-concentration region as impurity layers formed with a gate electrode being sandwiched there between.

As shown in FIG. 1A, in a semiconductor device 10 according to the present embodiment, a gate electrode 13 is formed on a main surface 11a of a semiconductor substrate 11, for instance, a p-type silicon substrate, with a gate insulating film 12 being sandwiched therebetween. A side wall insulating film 14 is formed on the side surface of the gate electrode 13.

In addition, n-type first impurity layers 15, 16 and n-type second impurity 17, 18 are formed in the semiconductor substrate 11. The first impurity layers 15, 16 are located under the side wall insulating film 14. The second impurity layers 17, 18 are adjacent to the first impurity layers 15, 16, respectively. The impurity concentration of the second impurity layers 17, 18 are higher than that of the first impurity layers 15, 16.

The first impurity layers 15, 16 constitute low-concentration regions in an extension structure configured to inhibit a short channel effect which occurs due to the miniaturization, and function as electric-field relaxing layers each configured to relax the electric field of the p-n junction interface. The second impurity layers 17, 18 are high-concentration regions, and respectively function as the drain and source.

The gate electrode 13 includes a metal-containing film 19 formed on the gate insulating film 12, and a polysilicon film 20 formed on the metal-containing film 19.

The metal-containing film 19 is 7 nm in thickness, for instance. The metal-containing film 19 is made of a refractory metal, or a chemical compound of a refractory metal except for an oxide, for instance titanium nitride (TiN). The metal-containing film 19 is provided to control a threshold voltage of the MOS transistor depending on the work function, and thereby to maintain the conventional threshold voltage even though the MOS transistor is miniaturized.

The polysilicon film 20 is 70 nm in thickness, for instance. The polysilicon film 20 is made of a polysilicon to which an impurity is doped. The polysilicon film 20 is provided to protect the metal-containing film 19, and concurrently to inhibit the increase in the resistance of the gate electrode 13.

Multiple MOS transistors are fabricated on the semiconductor substrate 11. The multiple MOS transistors are electrically separated from one another by insulating separation grooves 21.

As shown in FIG. 1B, the lower side surface of the gate electrode 13 including the metal-containing film 19 and the polysilicon film 20 is formed almost vertical to the main surface 11a of the semiconductor substrate 11, instead of being formed into a skirt shape or a tapered shape.

As a consequence, the gate length of each MOS transistor is controlled to be kept almost constant, and such control makes it possible to obtain semiconductor devices 10 having MOS transistors whose gate characters are equal to one another.

In the present description, the phrase "the side surface or shape of the gate electrode almost vertical to the substrate" means that an angle between the semiconductor substrate 11 and the side surface of the gate electrode 13 covers not only a right angle in a mathematical sense but also an angle within a range not affecting the gate characteristic.

Next, a method of manufacturing the semiconductor device 10 will be described. FIGS. 2 to 4 are cross-sectional views sequentially showing main portions of steps of manufacturing the semiconductor device.

Figure 2A:
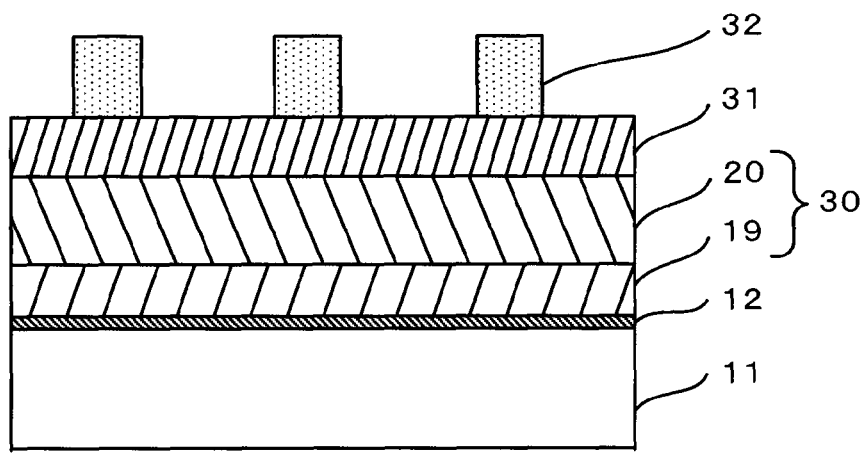
FIGS. 2A, 2B and 2C are cross-sectional views sequentially showing main portions of steps of manufacturing a semiconductor device according to the embodiment of the invention.

To begin with, as shown in FIG. 2A, as the gate insulating film 12, a silicon oxide film with a thickness of approximately 1.5 nm is formed on the main surface of the silicon substrate (semiconductor substrate) 11 by thermal oxidation, for instance. Subsequently, as the metal-containing film 19, a TiN film with a thickness of 7 nm is formed on the gate insulating film 12 by sputtering, for instance.

Thereafter, the polysilicon film 20 doped with phosphorus (P) and having a thickness of 70 nm is formed on the metal-containing film 19 by CVD (Chemical Vapor Deposition), for instance. The metal-containing film 19 and the polysilicon film 20 constitute a gate electrode film 30.

Afterward, as a mask material, a TEOS (Tetra Ethyl Ortho Silicate) film 31 with a thickness of 40 nm is formed on the gate electrode film 30 by CVD, for instance.

After that, a resist film 32 having a gate electrode pattern is formed on the TEOS film 31 by photolithography.

Figure 2B:
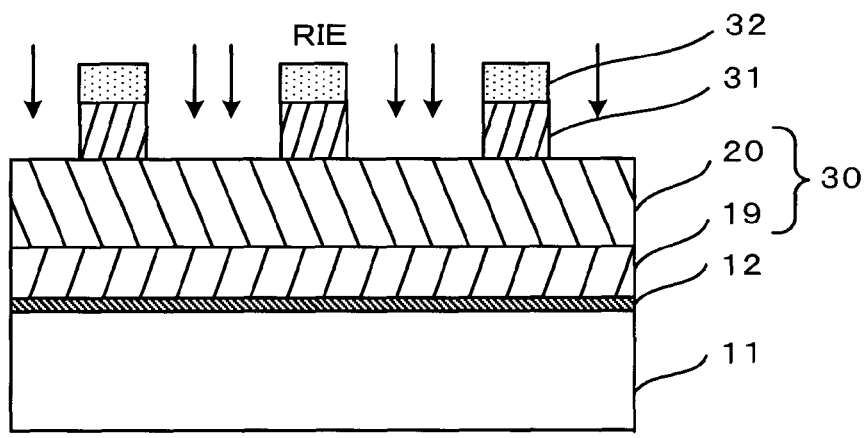

Subsequently, as shown in FIG. 2B, the TEOS film 31 is anisotropically etched by RIE (Reactive Ion Etching) using the resist film 32 as the mask with use of a fluorine-based gas. Thereby, the gate electrode pattern is transferred onto the TEOS film 31.

Figure 2C:
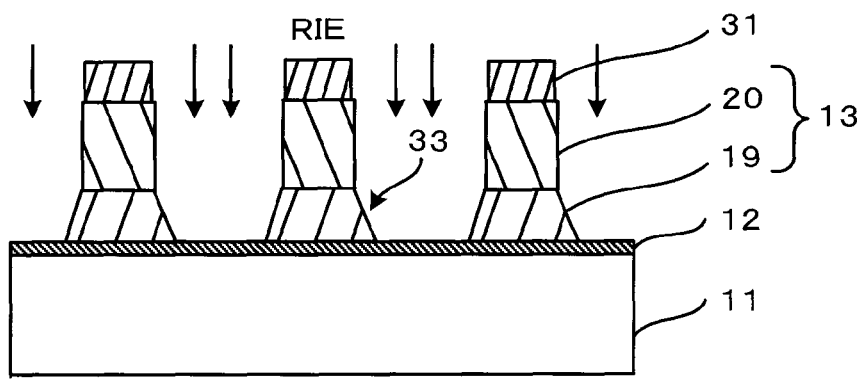

Thereafter, as shown in FIG. 2C, the resist film 32 is removed. Afterward, the polysilicon film 20 is anisotropically etched by RIE using the TEOS film 31 as the mask with use of a chlorine/bromine-based gas. After that, the metal-containing film 19 is anisotropically etched by RIE with use of a chlorine-based gas until the gate insulating film 12 is exposed to the outside.

During the etching, a skirt-shape region 33 is formed on the lower side surface of the gate electrode 13 for the following reasons. First, the gate electrode 13 has a three-dimensional structure. Second, reaction products are deposited there because titanium chlorides are low-volatile.

Figure 3A:
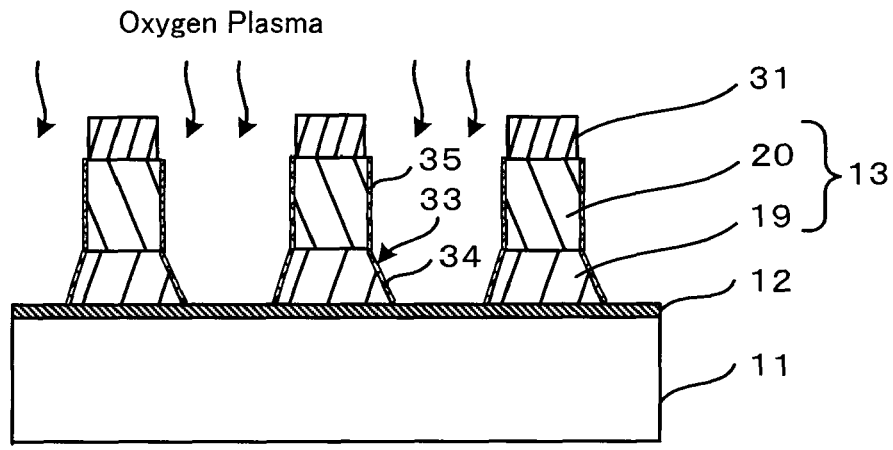
FIGS. 3A, 3B and 3C are cross-sectional views sequentially showing main portions of ensuing steps of manufacturing a semiconductor device according to the embodiment of invention.
Figure 4:
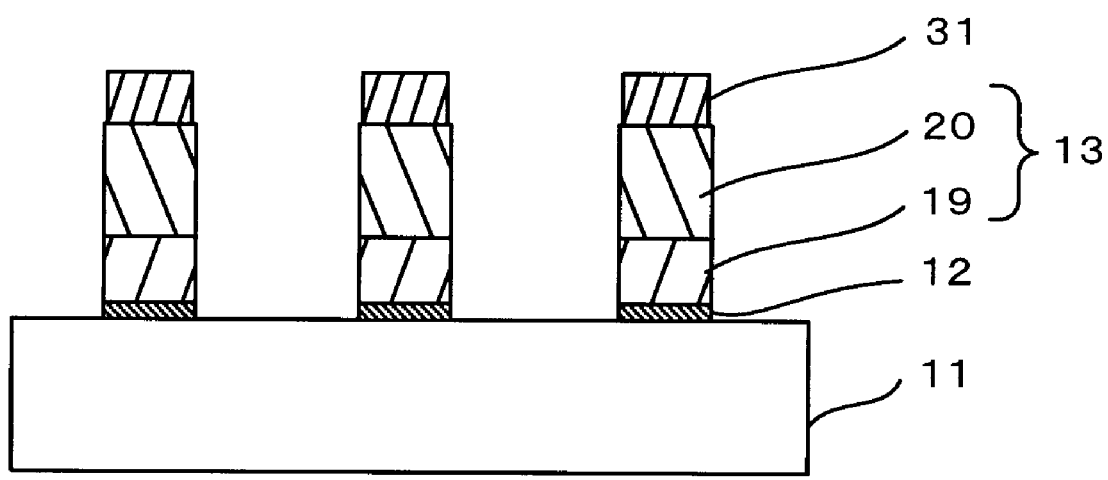
FIG. 4 is a cross-sectional view sequentially showing a main portion of a following step of manufacturing a semiconductor device according to the embodiment of invention.

Afterward, as shown in FIG. 3A, a portion of the side wall of the metal-containing film 19 is modified, and thereby the portion of the side wall of the metal-containing film 19 is formed into a modified film. For instance, oxygen plasma is irradiated on the gate electrode 13 including the skirt-shape region 33, and a portion of the side surface of the metal-containing film 19 is oxidized, thereby forming an oxidized film 34. During the oxidization process, a portion of the side surface of the polysilicon film 20 is inevitably formed into an oxidized film 35 as well.

Figure 3B:
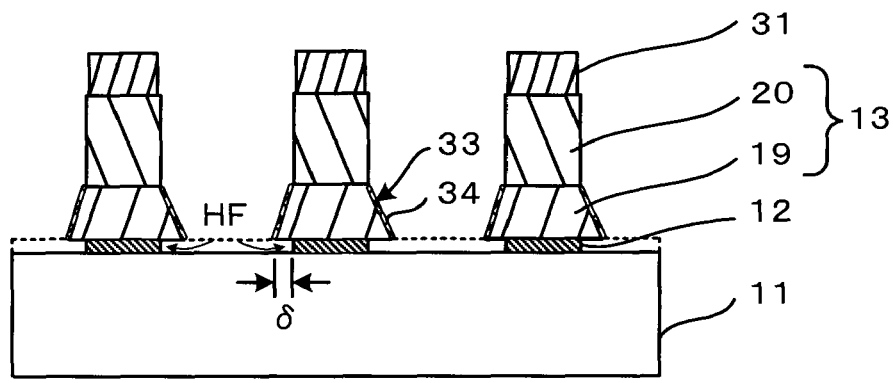

After that, as shown in FIG. 3B, the gate insulating film 12 is isotropically wet-etched by using a hydrogen fluoride solution as a chemical solution for the isotropic etching, for instance. Thereby, exposed portions of the gate insulating film 12 are removed, and other portions of the gate insulting film 12 sandwiched between the semiconductor substrate 11 and the metal-containing film 19 are made to recede.

An amount δ of recess of each gate insulating film 12 is defined as an amount which makes the width of a remaining portion of the gate insulating film 12 almost equal to the width of the corresponding polysilicon film 20 (the designed value of the gate length).

During the isotropic wet-etching, the oxidized film 35, on which the portion of the side surface of the polysilicon film 20 is formed, is inevitably etched out. On the other hand, the oxidized film 34, on which the portion of the side surface of the metal-containing film 19 is formed, remains unetched.

Figure 3C:
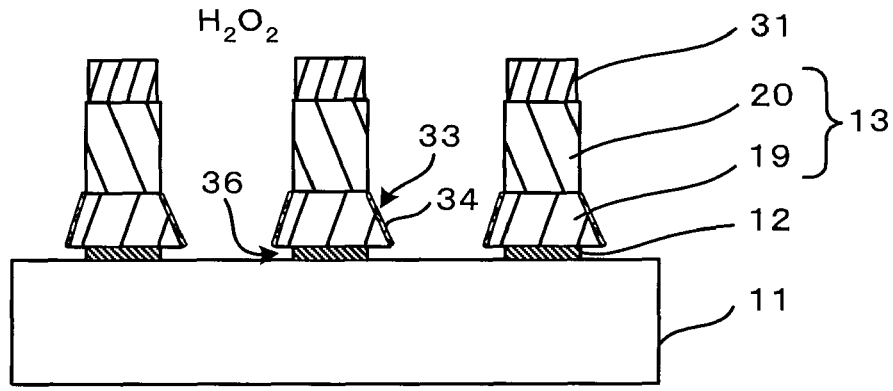

Subsequently, as shown in FIG. 3C, the metal-containing film 19 is selectively etched using a chemical solution containing an oxidant such as an aqueous solution of hydrogen peroxide ($H_2O_2$:$H_2O$).

Because the portion of the side surface of the metal-containing film 19 is beforehand formed on the oxidized film 34, the chemical solution enters a gap 36 between the semiconductor substrate 11 and the skirt-shape region 33 of the metal-containing film 19. Thereby, TiN is selectively etched from under the undersurface of the skirt-shape region 33 by the entering chemical solution.

Consequently, as shown in FIG. 4, only the skirt-shape region 33 is removed completely, and the gate electrode 13 is thus processed into a shape which is vertical to the semiconductor substrate 11. In addition, the oxidized film 34, on which the portion of the metal-containing film 19 is formed, is lifted off and removed.

Consequently, as shown in FIG. 4, only the skirt-like region 33 is removed completely, and the gate electrode 13 is thus processed into a shape which is vertical to the semiconductor substrate 11. In addition, the oxidized film 34, on which the portion of the metal-containing film 19 is formed, is lifted off and removed.

Thereafter, ions of an n-type impurity are implanted into the semiconductor substrate 11 by using the gate electrode 13 as the mask by a publicly-known method, for instance. Thereby, the first impurity layers 15, 16 are fabricated.

Afterward, the side wall insulating film 14 is formed on the side surface of the gate electrode 13. After that, ions of an n-type impurity are implanted into the semiconductor substrate 11 by using the gate electrode 13 and the side wall insulating film 14 as the mask. Thereby, the second impurity layers 17, 18 are formed.

To be specific, ions of arsenic (As), for instance, are implanted into the semiconductor substrate 11 in a direction perpendicular to the semiconductor substrate 11 with a dose of approximately 1E13 atoms/cm$^2$ by using the gate electrode 13 as the mask with a 10 keV acceleration voltage. Thereby, the first impurity layers 15, 16 of n-type, which serve as electric-field relaxing layers each configured to relax the electric field of the p-n junction interface, are fabricated.

Next, an insulating film such as a silicon nitride film with a thickness of approximately 100 nm is formed entirely on the semiconductor substrate 11 including the gate electrodes 13 by plasma CVD. Thereafter, the insulating film is etched out except for the side surface of the gate electrode 13 by RIE. Thereby, the side wall insulating film 14 is formed on the side surface of the gate electrode 13.

Subsequently, ions of arsenic (As), for instance, are implanted into the semiconductor substrate 11 in a direction perpendicular to the semiconductor substrate 11 with a dose of approximately 1E15 atoms/cm$^2$ by using the gate electrode 13 and the side wall insulating film 14 as the mask with a 20 keV acceleration voltage. Thereby, the second impurity layers 17, 18, which respectively serve as the drain D and the source S, are formed.

As a result, the semiconductor device 10, which includes the gate electrode 13 formed into the shape vertical to the semiconductor substrate 11 as shown in FIG. 1, is obtained.

As described above, in the method of manufacturing a semiconductor device according to the embodiment, the oxidized film 34 is formed by irradiating oxygen plasma on the sloped side surface of the skirt-shape region 33 which occurs when the gate electrode film 30 obtained by stacking the polysilicon film 20 on the metal-containing film 19 is anisotropically etched by RIE. Subsequently, the portion of the gate insulating film 12 sandwiched between the semiconductor substrate 11 and the skirt-shape region 33 is etched out using the fluoride solution. Thereafter, the skirt-shape portion 33 is selectively etched out using the chemical solution containing the oxidant.

Consequently, the etching advances from the gap 36 between the semiconductor substrate 11 and the skirt-shape region 33, and only the skirt-shape region 33 is removed. Thereby, the gate electrode 13 is processed into the shape vertical to the semiconductor substrate 11.

Accordingly, it is possible to obtain the method of manufacturing the semiconductor device which includes the gate electrode formed into the shape vertical to the substrate.

Here, description has been given of the case where the metal-containing film 19 is made of TiN. However, the metal-containing film 19 may be made of an element Ti instead of TiN. Furthermore, even in a case where tungsten (W) and tungsten nitride (WN) are otherwise selected as the refractory metals, the gate electrode can be similarly formed by changing the chemical solution or the like to another one.

Description has been given of a case where the recess of the gate insulating film 12 and the selective etching of the skirt-shape region 33 are achieved through a single series of processes. Instead, however, the recess of the gate insulating film 12 and the selective etching of the skirt-shape region 33 may be achieved through the series of processes repeated multiple times.

Figure 5A:
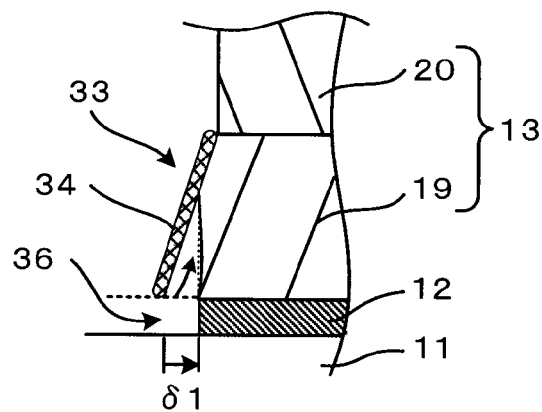
FIGS. 5A, 5B and 5C are cross-sectional views sequentially showing main portions of different steps of manufacturing a semiconductor device according to the embodiment of the invention.
Figure 5B:
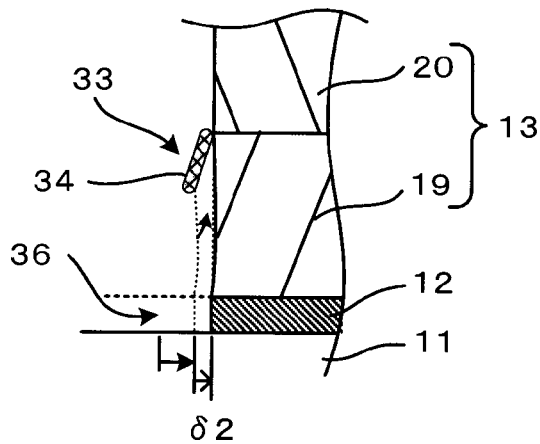
Figure 5C:
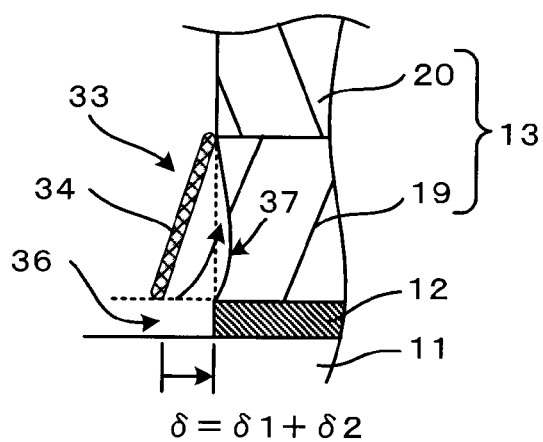

FIGS. 5A to 5C are diagrams showing a comparison between a case where the series of processes is repeated multiple times and a case where the single series of processes is performed to achieve the recess of the gate insulating film 12 and the selective etching of the skirt-shape region 33. FIGS. 5A and 5B show that the series of processes is repeated multiple times, and FIG. 5C shows that the single series of processes is performed. Firstly, description is given of the single series of processes.

As shown in FIG. 5C, in the case where the recess of the gate insulating film 12 and the selective etching of the skirt-shape region 33 are achieved by the single series of processes, over-etching due to change in manufacturing conditions, if any, may produce a retreat portion 37 in the side surface of the metal-containing film 19 by side-etching the side surface of the metal-containing film 19. As a result, gate electrodes may vary in shape from one to another.

On the other hand, in the case where the recess of the gate insulating film 12 and the selective etching of the skirt-shape region 33 are achieved through the series of processes repeated multiple times, the gate insulting film 12 sandwiched between the semiconductor substrate 11 and the skirt-shape region 33 is recessed by a distance δ1 at first, and then the skirt-shape region 33 is selectively etched out, as shown in FIG. 5A.

Thereafter, as shown in FIG. 5B, the gate insulating film 12 sandwiched between the semiconductor substrate 11 and the skirt-shape region 33 is additionally recessed by a distance δ2 (resulting in a total recess distance expressed with δ=δ1+δ2), and then the skirt-shape region 33 is selectively etched out additionally.

Thus, repeating the series of processes multiple times enhances the controllability of the selective etching of the skirt-shape region 33, and accordingly prevents the side surface of the metal-containing film 19 from being side-etched. Accordingly, the method described herein has an advantage of enabling stable fabrication of semiconductor devices including a gate electrode in a shape vertical to a substrate, although the number of processes is increased.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of manufacturing a semiconductor device comprising:
   forming a gate electrode by anisotropically etching a gate electrode film having a metal-containing film formed on a main surface of a semiconductor substrate via a gate insulating film to expose a portion of the gate insulating film;

forming a modified film on a side wall of the metal-containing film by modifying the side wall of the metal-containing film;

removing the exposed portion of the gate insulating film and recessing a portion of the gate insulating film sandwiched between the semiconductor substrate and the metal-containing film so as to recede from the modified side wall of the metal-containing film by isotropically etching the gate insulating film; and removing a side portion of the metal-containing film protruding from the receded gate insulating film by isotropically etching the metal-containing film.

2. The method of manufacturing the semiconductor device according to claim 1, wherein the gate electrode film is formed of a film to which the metal-containing film and a polysilicon film are stacked in this order, a skirt-shape region is formed on the side portion of the metal-containing film at the time when the gate electrode film is anisotropically etched.

3. The method of manufacturing the semiconductor device according to claim 2, wherein the skirt-shape region of the metal-containing film is removed and a side surface of a remaining portion of the metal-containing film is formed substantially vertical to the main surface of the semiconductor substrate in the isotropic etching of the metal-containing film.

4. The method of manufacturing the semiconductor device according to claim 1, wherein the side portion of the metal-containing film is removed from under an undersurface through a gap between the semiconductor substrate and the metal-containing film, the gap being formed after the gate insulating film recedes, and the modified film on the side wall of the removing portion of the metal-containing film is removed by liftoff in the isotropic etching of the metal-containing film.

5. The method of manufacturing the semiconductor device according to claim 1, wherein the modification of the side wall of the metal-containing film is carried out in an oxygen plasma atmosphere.

6. The method of manufacturing the semiconductor device according to claim 1, wherein the isotropic etching of the metal-containing film is carried out by a chemical solution containing an oxidant.

7. The method of manufacturing the semiconductor device according to claim 6, wherein the oxidant is a hydrogen peroxide.

8. The method of manufacturing the semiconductor device according to claim 1, wherein the recess of the portion of the gate insulating film sandwiched between the semiconductor substrate and the metal-containing film and the removal of the side portion of the metal-containing film are repeated a plurality of times.

9. The method of manufacturing the semiconductor device according to claim 5, wherein the metal-containing film is made of a refractory metal or a chemical compound of a refractory metal except for an oxide of a refractory metal.

10. The method of manufacturing the semiconductor device according to claim 9, wherein the refractory metal is titanium or tungsten.

11. A method of manufacturing a semiconductor device comprising:

forming a gate electrode by anisotropically etching a gate electrode film formed on a main surface of a semiconductor substrate via a gate insulating film to expose a portion of the gate insulating film, the gate electrode film having a metal-containing film and a polysilicon film stacked in this order;

forming an oxidized film on a side wall of the metal-containing film by oxidizing the side wall of the metal-containing film;

removing the exposed portion of the gate insulating film and recessing a portion of the gate insulating film sandwiched between the semiconductor substrate and the metal-containing film so as to recede from the oxidized side wall of the metal-containing film by isotropically etching the gate insulating film; and removing a side portion of the metal-containing film protruding from the receded gate insulating film by isotropically etching the metal-containing film.

12. The method of manufacturing the semiconductor device according to claim 11, wherein a skirt-shape region is formed on the side portion of the metal-containing film at the time when the gate electrode film is anisotropically etched.

13. The method of manufacturing the semiconductor device according to claim 12, wherein the skirt-shape region of the metal-containing film is removed and a side surface of a remaining portion of the metal-containing film is formed substantially vertical to the main surface of the semiconductor substrate in the isotropic etching of the metal-containing film.

14. The method of manufacturing the semiconductor device according to claim 11, wherein the side portion of the metal-containing film is removed from under an undersurface through a gap between the semiconductor substrate and the metal-containing film, the gap being formed after the gate insulating film recedes, and the oxidized film on the side wall of the removing portion of the metal-containing film is removed by liftoff in the isotropic etching of the metal-containing film.

15. The method of manufacturing the semiconductor device according to claim 11, wherein the oxidization of the side wall of the metal-containing film is carried out in an oxygen plasma atmosphere.

16. The method of manufacturing the semiconductor device according to claim 11, wherein the isotropic etching of the metal-containing film is carried out by a chemical solution containing an oxidant.

17. The method of manufacturing the semiconductor device according to claim 16, wherein the oxidant is a hydrogen peroxide.

18. The method of manufacturing the semiconductor device according to claim 11, wherein the recess of the portion of the gate insulating film sandwiched between the semiconductor substrate and the metal-containing film and the removal of the side portion of the metal-containing film are repeated a plurality of times.

19. The method of manufacturing the semiconductor device according to claim 11, wherein the metal-containing film is made of a refractory metal or a chemical compound of a refractory metal except for an oxide of a refractory metal.

20. The method of manufacturing the semiconductor device according to claim 19, wherein the refractory metal is titanium or tungsten.

* * * * *